United States Patent
Ball

(10) Patent No.: US 7,228,467 B2
(45) Date of Patent: Jun. 5, 2007

(54) CORRECTING DATA HAVING MORE DATA BLOCKS WITH ERRORS THAN REDUNDANCY BLOCKS

(75) Inventor: Matt Ball, Boulder, CO (US)

(73) Assignee: Quantum Corporation, San Jose, CA (US)

( * ) Notice: Subject to any disclaimer, the term of this patent is extended or adjusted under 35 U.S.C. 154(b) by 510 days.

(21) Appl. No.: 10/688,027

(22) Filed: Oct. 17, 2003

(65) Prior Publication Data

US 2005/0081131 A1  Apr. 14, 2005

Related U.S. Application Data

(60) Provisional application No. 60/510,657, filed on Oct. 10, 2003.

(51) Int. Cl.
*G11C 29/42* (2006.01)
*G11C 29/40* (2006.01)

(52) U.S. Cl. .................... 714/710; 714/752

(58) Field of Classification Search ........... 714/752, 714/758, 756, 784, 798, 53, 703, 759, 781, 714/782, 785, 755, 710, 768, 763, 764, 766
See application file for complete search history.

(56) References Cited

U.S. PATENT DOCUMENTS

| | | | |
|---|---|---|---|
| 3,508,195 A * | 4/1970 | Sellers, Jr. ................ 714/703 |
| 3,860,907 A * | 1/1975 | Marshall .................... 714/798 |
| 4,782,490 A * | 11/1988 | Tenengolts ................ 714/756 |
| 5,136,592 A | 8/1992 | Weng |
| 5,905,740 A * | 5/1999 | Williamson .............. 714/784 |
| 6,845,475 B1 * | 1/2005 | He .............................. 714/53 |
| 2004/0260971 A1 | 12/2004 | Ball |

OTHER PUBLICATIONS

"Error-Correcting Codes" by William Wesley Peterson and E.J. Weldon, Jr., second edition, 1972, printing 1996, pp. 296-299.*
Cyclic Decoding Procedures for Bose-Chaudhuri-Hocquenghem Codes, IEEE Trans., IT-10, pp. 357-363, R.T. Chien, vol. 10, Issue 4, Oct. 1964.

* cited by examiner

*Primary Examiner*—Albert Decady
*Assistant Examiner*—Dipakkumar Gandhi
(74) *Attorney, Agent, or Firm*—Morrison & Foerster LLP

(57) ABSTRACT

Errors in data retrieved from a storage medium are corrected by retrieving a plurality of data blocks from the storage medium. A plurality of redundancy blocks associated with the plurality of data blocks are also retrieved from the storage medium. The number of data blocks with errors from the plurality of data blocks retrieved from the storage medium is determined. When the number of data blocks with errors exceeds the number of redundancy blocks, the data blocks are corrected in data segments, where a data segment includes data from a portion of each of the plurality of data blocks retrieved from the storage medium.

45 Claims, 5 Drawing Sheets

CORRECTING DATA HAVING MORE DATA BLOCKS WITH ERRORS THAN REDUNDANCY BLOCKS

CROSS-REFERENCE TO RELATED APPLICATION

This application claims priority of an earlier filed provisional application U.S. Provisional Application Ser. No. 60/510,657, titled CORRECTING DATA HAVING MORE DATA BLOCKS WITH ERRORS THAN REDUNDANCY BLOCKS, filed Oct. 10, 2003, which is incorporated herein by reference in its entirety.

BACKGROUND

1. Field of the Invention

The present application generally relates to correcting data retrieved from a storage medium, and more particularly to correcting data having more data blocks with errors than redundancy blocks.

2. Related Art

Data is stored in a storage device by writing the data to a storage medium in the storage device. The stored data can be later retrieved from the storage device by reading the data from the storage medium. However, for a number of reasons, an error may exist in the data retrieved from the storage device, meaning that the stored data cannot be retrieved or is different from the data originally stored on the storage medium. For example, a portion of the stored data on the storage medium may degenerate over time such that the portion of the stored data cannot be properly read at a later time.

In a conventional technique to correct such errors, a set of redundancy blocks is generated for the data and stored with the data in the storage medium. When the stored data is later retrieved and an error is detected, the redundancy blocks are used to correct the retrieved data. Typically, when the data has more data blocks with errors than redundancy blocks, however, the data can not be corrected.

SUMMARY

In one exemplary embodiment, errors in data retrieved from a storage medium are corrected by retrieving a plurality of data blocks from the storage medium. A plurality of redundancy blocks associated with the plurality of data blocks are also retrieved from the storage medium. The number of data blocks with errors from the plurality of data blocks retrieved from the storage medium is determined. When the number of data blocks with errors exceeds the number of redundancy blocks, the data blocks are corrected in data segments, where a data segment includes data from a portion of each of the plurality of data blocks retrieved from the storage medium.

DETAILED DESCRIPTION

The following description sets forth numerous specific configurations, parameters, and the like. It should be recognized, however, that such description is not intended as a limitation on the scope of the present invention, but is instead provided to provide a better description of exemplary embodiments.

Figure 1:
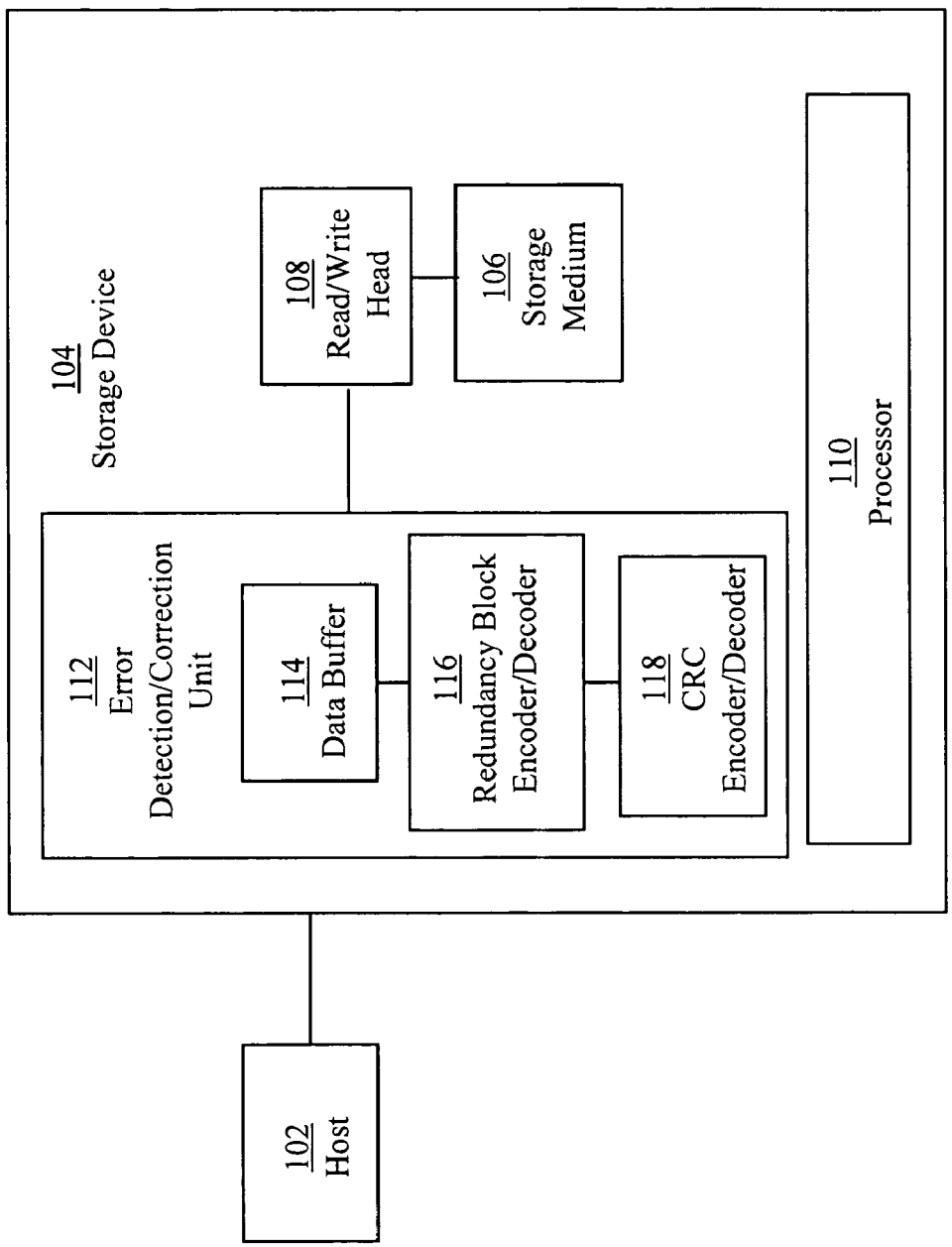
FIG. 1 depicts an exemplary host terminal connected to an exemplary storage device.

With reference to FIG. 1, a host terminal 102 is depicted connected to a storage device 104. Host computer 102 can be any type of computer, such as a personal computer, a workstation, a server, and the like. Storage device 104 can be any type of storage drive, such as a tape drive, a hard drive, and the like. It should be recognized that host terminal 102 can be connected to any number of storage devices 104, and any number of host terminals 102 can be connected to one or more storage devices 104.

With continued reference to FIG. 1, in one exemplary embodiment, storage device 104 is configured to detect and correct errors in data stored in storage device 104. More specifically, when data stored in storage device 104 is retrieved, storage device 104 is configured to use redundancy blocks, which are also referred to as error correction code (ECC) redundancy blocks, to correct errors in the retrieved data, such as if the retrieved data is different from the data that was originally stored in storage device 104 or if the stored data cannot be retrieved. Additionally, in the present exemplary embodiment, check sums, such as cyclic redundancy checking (CRC) codes, are used to detect errors in the retrieved data. However, it should be recognized that redundancy blocks can be used to detect as well as correct errors.

In the embodiment depicted in FIG. 1, storage device 104 includes a storage medium 106, a channel and read/write head 108, a processor 110, and an error detection/correction unit 112. In storage device 104, data is stored in storage medium 106. Read/write head 108 reads and/or writes data to storage medium 106. Processor 110 controls the operation of storage device 104, including the operation of channel and read/write head 108. As will be described in greater detail below, error detection/correction unit 112 detects and corrects errors in data stored in storage medium 106.

In the present exemplary embodiment, error detection/correction unit 112 includes a data buffer 114, a redundancy block encoder/decoder 116, and a CRC encoder/decoder 118. When data is to be stored on storage medium 106, data is received from host terminal 102 and written to data buffer 114. Redundancy block encoder/decoder 116 and CRC encoder/decoder 118 generate redundancy blocks and CRC codes for data in data buffer 114. Read/write head 108 then writes the data and the generated redundancy blocks and CRC codes to storage medium 106.

When data is to be read from storage medium 106, read/write head 108 reads data and the redundancy blocks from storage medium 106 to data buffer 114. As will be described in greater detail below, any errors in the data read from storage medium 106 are detected and corrected using the CRC codes and redundancy blocks. The data may then be transferred to host terminal 102.

In one exemplary embodiment, data is transferred between host terminal 102 and storage device 104 in data records, which are stored in a cache. The data records are divided into data blocks of a predetermined length, such as 2 kBytes, 4 kBytes, 6 kBytes, and the like. It should be recognized, however, that data blocks of various lengths may be used.

In the present exemplary embodiment, after data blocks are retrieved from storage medium 106, CRC codes are used to detect errors in the retrieved data blocks, where an error in a retrieved data block indicates that the data in the retrieved data block is different from the data in the data block when the data was originally stored in storage medium 106. More specifically, prior to storing a data block in storage medium 106, a CRC code is generated for the data block and stored with the data block in storage medium 106. When the data block is later retrieved, a new CRC code is generated for the retrieved data block. The new CRC code is then compared to the CRC code retrieved from storage medium 106, which corresponds to the retrieved data block and was originally generated for the retrieved data block before storing the retrieved data block in storage medium 106. If the new CRC code and the retrieved CRC code differ, then an error is detected for that data block.

Additionally, in the present exemplary embodiment, redundancy blocks are used to correct errors in the retrieved data blocks. More specifically, prior to storing data blocks in storage medium 106, redundancy blocks are generated based on the data blocks, and stored with the data blocks in storage medium 106. As will be described in greater detail below, when the data blocks are later retrieved, data blocks identified as having errors are corrected using the redundancy blocks.

In one exemplary embodiment, redundancy blocks 204 are Bose-Chaudhuri-Hocquenghem (BCH) codes, and more particularly Reed-Soloman codes. For a more detailed description of Reed-Solomon codes, see Peterson & Weldon, Error Correcting Codes, 2d Edition, MIT Press, 1972, which is incorporated in its entirety herein by reference. It should be recognized, however, that various types of error correction codes may be used.

Figure 2:
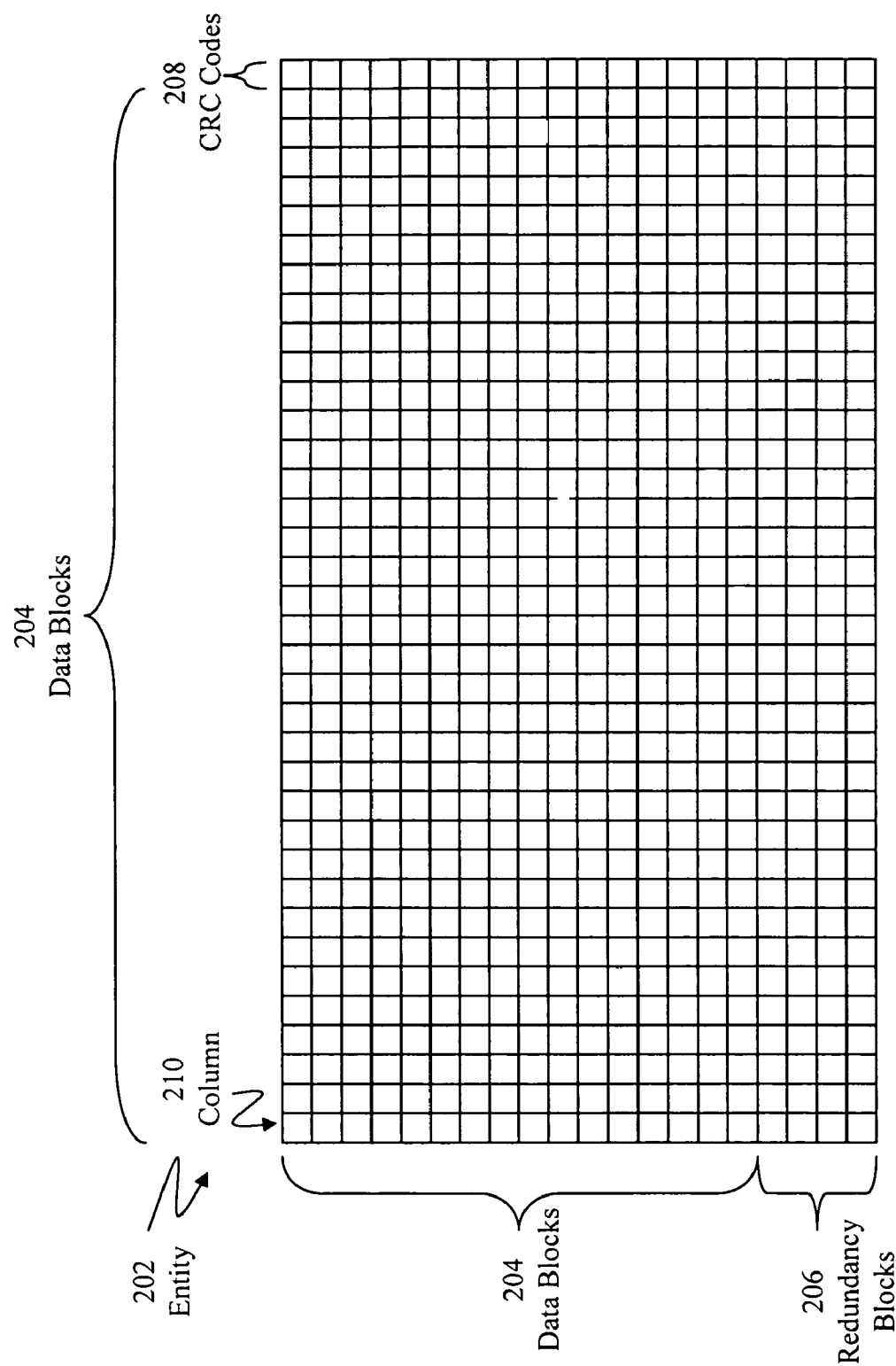
FIG. 2 depicts an exemplary entity having a set of data blocks, redundancy blocks, and cyclic redundancy checking codes.

In one exemplary embodiment, a set of data blocks, a set of redundancy blocks, and a set of CRC codes can be read and written together as a group referred to as an "entity." For example, with reference to FIG. 2, an entity 202 is depicted having 16 data blocks 204, four redundancy blocks 206, and 20 CRC codes 208. It should be recognized, however, that entity 202 can include various numbers of data blocks 204, redundancy blocks 206, and CRC codes 208. Additionally, as noted above, redundancy blocks can be used to detect as well as correct errors in the retrieved data blocks. Thus, CRC codes 208 can be replaced with a set of redundancy blocks.

FIG. 2 depicts the form in which entity 202 is stored in data buffer 114 (FIG. 1). However, it should be recognized that entity 202 need not exist physically in the form depicted in FIG. 2. It should also be recognized that data in entity 202, and more particularly the data in a data block 204, need not correspond to a single file. Instead, in one exemplary embodiment, data received from host terminal 102 (FIG. 1) is interleaved. As such, the data in a particular data block 204 can correspond to portions of separate files received from host terminal 102 (FIG. 1).

Figure 3:
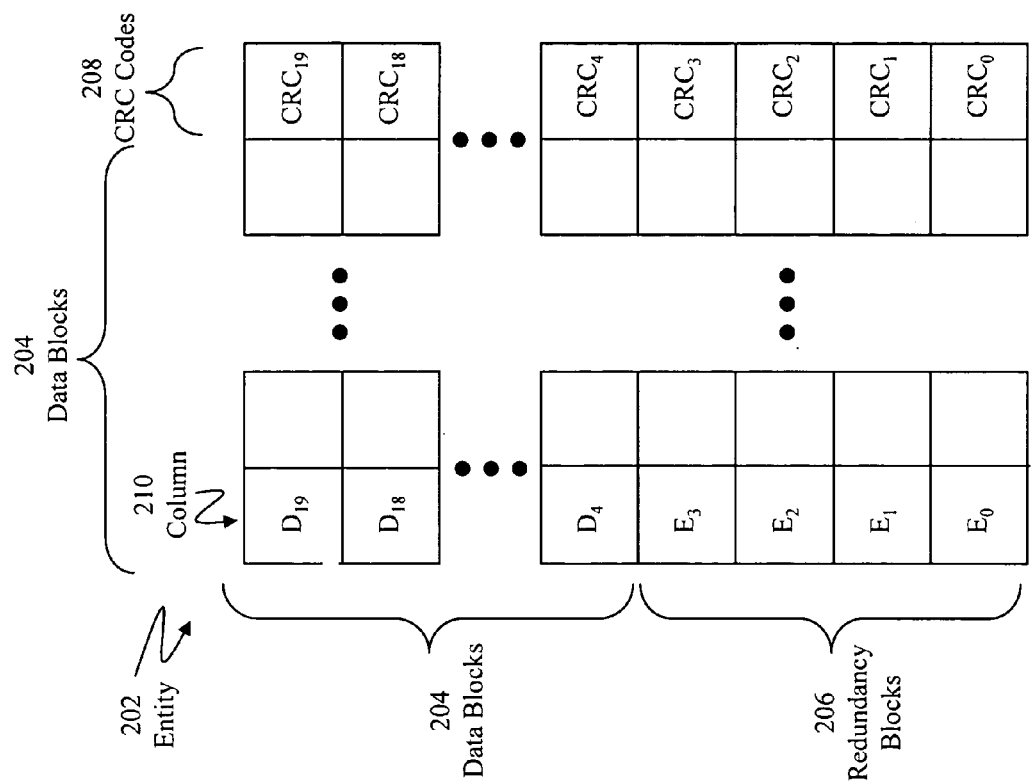
FIG. 3 depicts portions of the exemplary entity of FIG. 2.

FIG. 2 also depicts logical relationships between data blocks 204, redundancy blocks 206, and CRC codes 208 of entity 202. With reference to FIG. 3, portions of entity 202 are shown in greater detail to more clearly illustrate the logical relationships between data blocks 204, redundancy blocks 206, and CRC codes 208.

As depicted in FIG. 3, a CRC code 208 corresponds to a data block 204 or redundancy block 206 and is used to detect an error in data block 204 or redundancy block 206. For example, CRC code $CRC_{19}$ corresponds to data block $D_{19}$ of entity 202. Thus, to detect an error in data block $D_{19}$, after retrieving data block $D_{19}$ from storage medium 106 (FIG. 1), a new CRC code $CRC_{19}'$ is generated for retrieved data block $D_{19}$. The new CRC code $CRC_{19}'$ is then compared to the CRC code retrieved from storage medium 106 (FIG. 1) corresponding to retrieved data block $D_{19}$ (i.e., CRC code $CRC_{19}$). If the new CRC code $CRC_{19}'$ and the retrieved CRC code $CRC_{19}$ differ, then an error is detected for data block $D_{19}$.

In the present exemplary embodiment, one redundancy block may be used to correct one data block 204 of entity 202. Thus, in the example depicted in FIG. 2, a total of four redundancy blocks 206 may be used to correct a total of four data blocks 204 of entity 202 having a total of 16 data blocks 204. For example, redundancy block $E_3$ may be used to correct a first data block of entity 202. Redundancy block $E_2$ may be used to correct a second data block of entity 202. Redundancy block $E_1$ may be used to correct a third data block of entity 202. Redundancy block $E_0$ may be used to correct a fourth data block of entity 202.

In the present exemplary embodiment, each redundancy block 206 is generated based on the data in all of the data blocks of entity 202. For example, redundancy block $E_0$, $E_1$, $E_2$, and $E_3$ are each generated based on the data in data blocks $D_4$, $D_2$, . . . , and $D_{19}$. As described above, with reference to FIG. 1, redundancy blocks are generated by redundancy block encoder 116. As also described above, redundancy blocks are initially generated for data received from host terminal 102. The generated redundancy blocks and the received data are then stored in storage medium 106.

With reference again to FIG. 3, although redundancy blocks $E_0$, $E_1$, $E_2$, and $E_3$ are generated based on the same set of data (i.e., data blocks 204 of entity 202), each redundancy block 206 is unique as to each other. More specifically, in the present embodiment, redundancy blocks $E_0$, $E_1$, $E_2$, and $E_3$ are Bose-Chaudhuri-Hocquenghem (BCH) codes, and more particularly Reed-Solomon codes. Redundancy blocks $E_0$, $E_1$, $E_2$, and $E_3$ are generated using redundancy block encoder 116 (FIG. 1). For a description of an exemplary encoder, see U.S. Pat. No. 5,136,592, titled ERROR DETECTION AND CORRECTION SYSTEM FOR LONG BURST ERRORS, issued on Aug. 4, 1992, which is incorporated herein by reference in its entirety.

Figure 4:
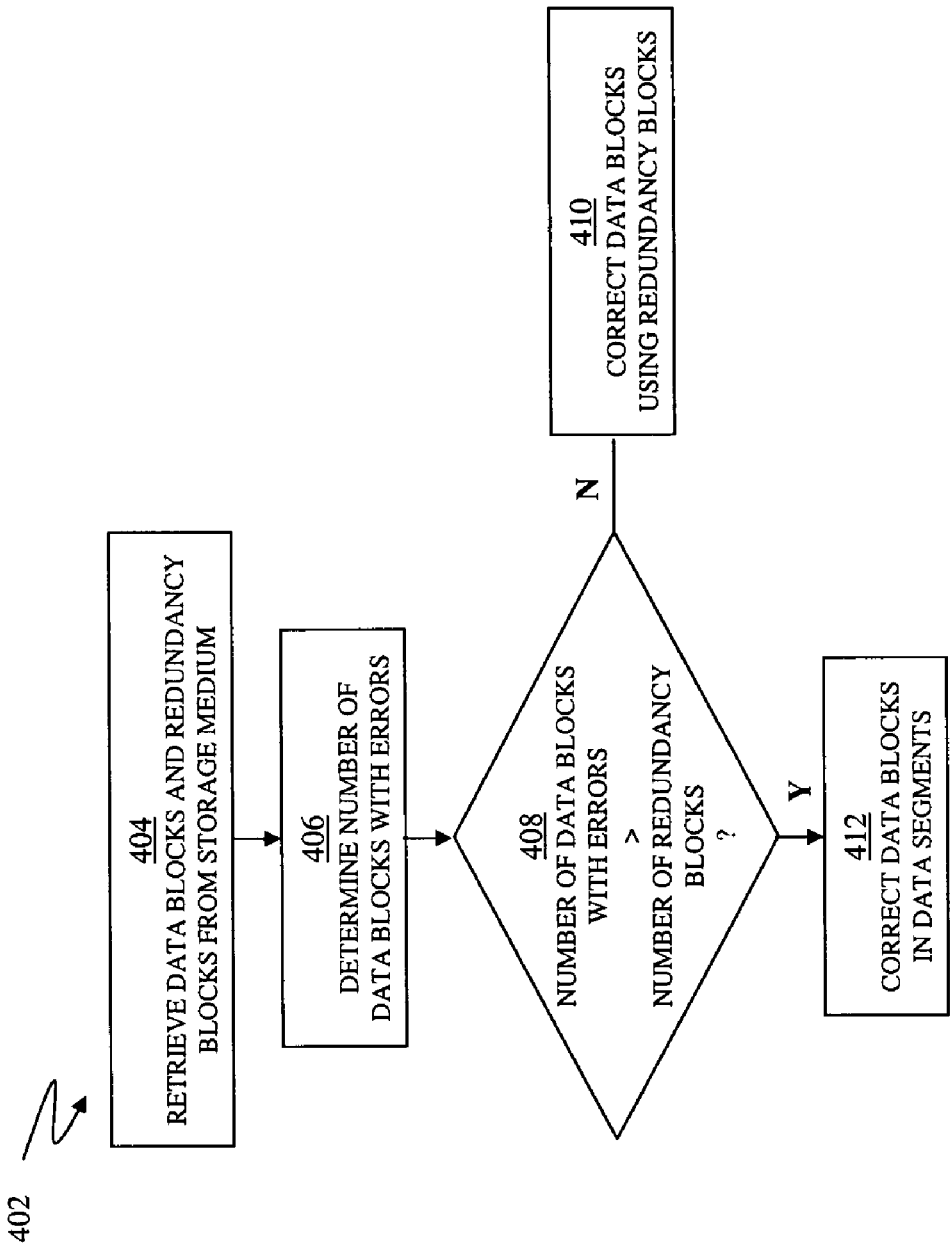
FIG. 4 depicts an exemplary process to correct data retrieved from a storage medium.

With reference to FIG. 4, an exemplary process 402 is depicted for correcting data retrieved from a storage medium. More specifically, FIG. 4 depicts exemplary process 402 implemented as a computer program, which includes computer executable instructions to direct the operation of a storage device. For example, with reference to FIG. 1, the process depicted in FIG. 4 can direct the operation of processor 110 of storage device 104. It should be recognized, however, that exemplary process 402 (FIG. 4) can be implemented in hardware, such as in an Application-Specific Integrated Circuit (ASIC).

With reference to FIG. 4, it should be recognized that process 402 assumes that a set of redundancy blocks were previously generated for a set of data blocks, and the set of redundancy blocks and the set of data blocks were previously stored on the storage medium. Thus, in the example depicted in FIG. 2, four redundancy blocks 206 were previously generated and stored for the 16 data blocks 204. As noted above, it should be recognized that any number of redundancy blocks can be generated and stored for any number of data blocks.

With reference again to FIG. 4, in 404, a set of data blocks and set of redundancy blocks are retrieved from the storage medium. Additionally, in the present exemplary embodiment, a set of check sums, such as CRC codes, are retrieved from the storage medium. As noted above, another set of redundancy blocks can be used rather than the set of CRC codes.

In 406, the number of data blocks with errors is determined. As described above, check sums, such as CRC codes, can be used to identify data blocks that have errors.

More particularly, in one exemplary embodiment in which storage device 104 (FIG. 1) is a tape drive and storage medium 106 (FIG. 1) is a magnetic tape, the data blocks and redundancy blocks are read from the magnetic tape and stored in a data buffer. As a data block or a redundancy block is read, the CRC code corresponding to the data block or redundancy block is also read from the magnetic tape. A new CRC code is generated based on the data block or redundancy block read from the magnetic tape, then the new CRC code is compared with the retrieved CRC code. If the new CRC code and the retrieved CRC code differ, then an error is detected and the retrieved data block or redundancy block is flagged as having an error. Thus, in this exemplary embodiment, the CRC codes are not stored in the data buffer with the retrieved data blocks and redundancy blocks. It should be recognized, however, that the CRC codes can be stored for later use. Additionally, the data blocks, redundancy blocks, and the CRC codes can be retrieved from the magnetic tape and stored in the data buffer together, then the data blocks and/or redundancy blocks having errors can be identified using the CRC codes stored in the data buffer.

In 408, the number of data blocks with errors is compared to the number of redundancy blocks. In the example depicted in FIG. 2, the number of redundancy blocks is four.

In 410, if the number of data blocks with errors is not greater than, meaning equal to or less than, the number of redundancy blocks, then the data blocks are corrected using the redundancy blocks. More particularly, as described above, one redundancy block can be used to correct one data block in the set of data blocks retrieved from the storage medium. Thus, when the number of data blocks with errors is not greater than the number of redundancy blocks, the redundancy blocks can be used to correct all of the data blocks with errors. For a more detailed description of an exemplary process of correcting data using redundancy blocks, see U.S. patent application Ser. No. 10/454,420, titled CORRECTING DATA USING REDUNDANCY BLOCKS, filed on Jun. 3, 2003, which is incorporated herein by reference in its entirety.

In 412, if the number of data blocks with errors is greater than the number of redundancy blocks, the data blocks are corrected in data segments, where a data segment includes a portion of data from each data block. For example, with reference to FIG. 1, a column 210 of entity 202 includes a portion of data from each data block 204, and portion of each redundancy block 206. Each column 210 of entity 202 is referred to herein as a code word 210. Thus, a data segment corresponds to the portion of a code word 210 with data from data blocks 204. In one exemplary embodiment, a code word 210 includes an 8-bit symbol of each data block 204 and redundancy block 206 in entity 202. Thus, when data blocks 204 are 2 kbytes long, then there are 2,000 codewords and 2,000 data segments. It should be recognized, however, that code words 210 and data blocks 204 can be any lengths.

Figure 5:
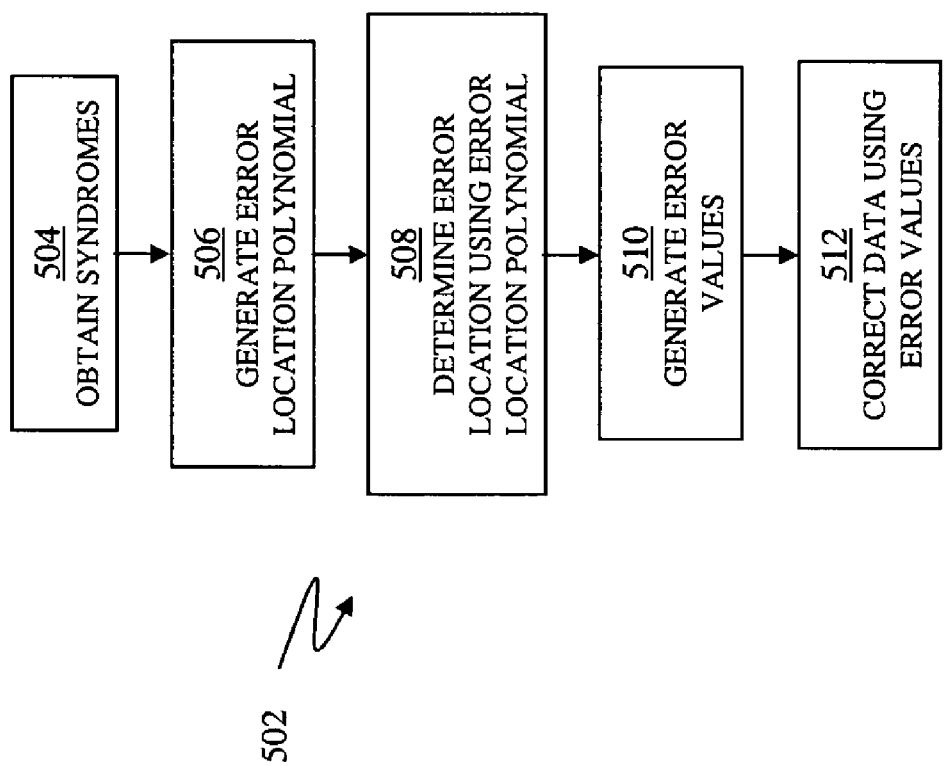
FIG. 5 depicts an exemplary process to correct data when the number of data blocks is greater than the number of redundancy blocks.

With reference to FIG. 5, an exemplary process 502 is depicted for corrected data when the number of data blocks is greater than the number of redundancy blocks. More particularly, each data segment of the data blocks are processed in accordance with exemplary process 502. Similar to process 402 depicted in FIG. 4, exemplary process 502 can be implemented as a computer program, which includes computer executable instructions to direct the operation of a storage device. For example, with reference to FIG. 1, the process depicted in FIG. 5 can direct the operation of processor 110 of storage device 104. It should be recognized, however, that exemplary process 502 (FIG. 5) can be implemented in hardware, such as in an Application-Specific Integrated Circuit (ASIC).

With reference again to FIG. 5, in 502, syndromes, which are also known as partial syndromes, for the data segment being processed are obtained. The number of syndromes corresponds to the number of redundancy blocks. Thus, in the example depicted in FIG. 3, four syndromes (i.e., $S_0$, $S_1$, $S_2$, and $S_3$) for a data segment is obtained.

In one exemplary embodiment, the syndromes are computed from residual blocks, which are generated based on the redundancy blocks. More particularly, in the present exemplary embodiment, new redundancy blocks are generated based on the retrieved data blocks. In generating new redundancy blocks based on the retrieved data blocks, the data blocks identified as having errors in 408 (FIG. 4) are replaced with dummy data blocks containing all zeros. Alternatively, the new redundancy blocks can be generated based on the retrieved data blocks while keeping the data blocks identified as having error. Additionally, in the present exemplary embodiment, with reference to FIG. 1, new redundancy blocks are generated using redundancy block encoder 118. The residual blocks are then generated based on the new redundancy blocks and the retrieved redundancy blocks. More specifically, a residual block is generated by performing an Exclusive-OR (XOR) operation between a new redundancy block and a retrieved redundancy block. Mathematically the residual block is a remainder from dividing a retrieved code word by a generator polynomial. The syndromes are then computed from the residual blocks.

For example, syndromes $S_0$, $S_1$, $S_2$, and $S_3$ can be computed using the following equation:

$$\begin{bmatrix} S_0 \\ S_1 \\ S_2 \\ S_3 \end{bmatrix} = \begin{bmatrix} 1 & 1 & 1 & 1 \\ 1 & \alpha & \alpha^2 & \alpha^3 \\ 1 & \alpha^2 & \alpha^4 & \alpha^6 \\ 1 & \alpha^3 & \alpha^6 & \alpha^9 \end{bmatrix} \begin{bmatrix} R_0 \\ R_1 \\ R_2 \\ R_3 \end{bmatrix}, \quad (1)$$

where $R_0$, $R_1$, $R_2$, and $R_3$ are portions of the residual blocks, which were generated based on redundancy blocks, and $\alpha$ is a primitive element in a Galois Field. Note that computing syndromes $S_0$, $S_1$, $S_2$, and $S_3$ using equation (1) can require 16 multiplication operations. Note also that if $R_0$, $R_1$, $R_2$, and $R_3$ are zero, then the data segment has no errors. In which case, the next data segment is processed. It should be recognized that syndromes $S_0$, $S_1$, $S_2$, and $S_3$ can be directly obtained rather than generated based on residual blocks.

In 506, an error location polynomial is generated based on the obtained syndromes. When evaluated at an error location, the error location polynomial equal zeros. The following are definitions of error location polynomials for two errors (equation 2a) and one error (equation 2b):

$$\Sigma(x) = x^2 + \sigma_1 x + \sigma_0 \quad (2a)$$

$$\Sigma(x) = x + \sigma_0 \quad (2b)$$

where x is an error location and $\sigma_0$, $\sigma_1$, are coefficients. It should be recognized that the error location polynomials can be solved using various known algorithms, such as the Berlekamp-Massey algorithm.

In one exemplary embodiment, the error location polynomial is computed by first determining whether there are less than two errors in the data segment. More particularly, the determinate of the following matrix is computed:

$$\begin{bmatrix} S_0 & S_1 \\ S_1 & S_2 \end{bmatrix} \begin{bmatrix} \sigma_0 \\ \sigma_1 \end{bmatrix} = \begin{bmatrix} S_2 \\ S_3 \end{bmatrix} \quad (3)$$

The determinate of matrix (3) is $D = S_0 S_2 + S_1^2$.

If the determinate of matrix (3) is zero, then there are less than two errors in the data segment. In this case, the terms of the error location polynomial (equation (2b)) are computed using the following equations:

$$S_0 = S_1 \sigma_0 \quad (4a)$$

$$\sigma_0 = S_1 / S_0 \quad (4b)$$

Note that if $S_0$ is zero, then there are no errors in the data segment being examined. However, as described above, in one exemplary embodiment, the syndromes are computed from residuals, and a data segment is examined when the residuals corresponding to the data segment is not zero. Thus, in this case, if $S_0$ is zero, then the data segment can not be corrected using this process.

If the determinate of matrix (3) is not zeros then there are at least two errors in the data segment. In this case, the terms of the error location polynomial (equation (2a)) are computed using the following equations:

$$D = S_1^2 + S_0 S_2 \quad (5a)$$

$$\sigma_0 = \frac{S_1 S_3 + S_2^2}{D} \quad (5b)$$

$$\sigma_1 = \frac{S_0 S_3 + S_1 S_2}{D} \quad (5c)$$

Note that solving equations (5a)–(5c) can require 6 multiplication operations and 2 division applications. Alternatively, solving equations (5a)–(5c) can require 8 multiplication operation and 1 inversion operation.

In 508, the location of the error within the data segment is determined from the error location polynomial. More particularly, the location of the error within the data segment is determined by determining the root of the error location polynomial. As noted above, when evaluated at a location with an error, the error location polynomial is zero.

Thus, when there is one error in the data segment, the location of the error within the data segment can be determined using two of the syndromes. In the present example, the location of the error within the data segment can be determined by combining equations (4b) and (2b):

$$x = S_1 / S_0 \quad (6)$$

To further verify the error location, the error location can be determined using different combinations of the syndromes. In the present example, the following can be computed:

$$x' = S_2 / S_1 \quad (6')$$

$$x'' = S_3 / S_2 \quad (6'')$$

If the syndromes are zero or the error locations are not the same, then the error location is not correct. In the present example, if $S_1$ or $S_2$ equals zero, or x is not equal to x' and x", then the error location x is not correct. These additional checks reduce the single error miss-correction rate down to about 5 in $2^{24}$.

When there are two errors in the data segment, the locations of the errors within the data segment can be determined by solving the root of equation (2a) with the terms determined by equations (5a)–(5c). However, because Galois field math does not allow for the use of quadratic equations, a table is use to solve the root of equation (2a).

Alternatively, an exhaustive search, such as a Chien Search, is used. More particularly, equation (2a) is evaluated at each potential error location within the data segment. More particularly, as described above, in one exemplary embodiment, check sums, such as CRC codes, are used to indicate data blocks that have errors. However, because a check sum corresponds to an entire data block, the location within the data segment corresponding to the data block indicated as having an error by the check sum may or may not have an error. Thus, equation (2a) is evaluated at each location within the data segment indicated as potentially having an error by the check sum. If exactly two error locations are not found, then the search has failed, and the data segment is not correctable. Note that testing each location can require two multiplication operations and two addition operations.

In 510, an error value is generated based on the determined error locations within the data segment. When there is one error in the data segment, the error value is simply the syndrome. Thus, in the present example, the error value, $Y_0$, is:

$$Y_0 = S_0 \quad (8)$$

When there are two errors in the data segment, the error values, Y0 and Y1, can be determined using the following equation:

$$\begin{bmatrix} 1 & 1 \\ x_0 & x_1 \end{bmatrix} \begin{bmatrix} Y_0 \\ Y_1 \end{bmatrix} = \begin{bmatrix} S_0 \\ S_1 \end{bmatrix} \quad (9)$$

Equation (9) is then solved for $Y_o$ and $Y_1$:

$$Y_0 = \frac{x_1 S_0 + S_1}{x_0 + x_1} \quad (10a)$$

$$Y_1 = \frac{x_0 S_0 + S_1}{x_0 + x_1} \quad (10b)$$

Note that computing $Y_0$ and $Y_1$ can require two multiplication operations and two division operations. Alternatively, $Y_0$ and $Y_1$ can be computed using four multiplication operations and one inversion operation.

In 512, the error in the data segment can be corrected using the error value. More particularly, the erroneous data at the location in data segment is multiplied by the error value for the location determined in 510 to generate the correct data for the location within the data segment.

As described above, process 502 can be repeated for another data segment. More particularly, in one exemplary embodiment, each data segment of entity 202 (FIG. 2) is processed in accordance with process 502.

Although exemplary embodiments have been described, various modifications can be made without departing from the spirit and/or scope of the present invention. Therefore, the present invention should not be construed as being limited to the specific forms shown in the drawings and described above.

I claim:

1. A method of correcting errors in data retrieved from a storage medium, comprising:
retrieving a plurality of data blocks from the storage medium;
retrieving a plurality of redundancy blocks associated with the plurality of data blocks from the storage medium;
determining a number of data blocks with errors from the plurality of data blocks retrieved from the storage medium;
determining if the number of data blocks with errors exceeds a number of redundancy blocks retrieved from the storage medium; and
when the number of data blocks with errors exceeds the number of redundancy blocks, correcting the data blocks in data segments, wherein a data segment includes data from a portion of each of the plurality of data blocks retrieved from the storage medium.

2. The method of claim 1, further comprising:
when the number of data blocks with errors does not exceed the number of redundancy blocks, correcting the data blocks using the redundancy blocks.

3. The method of claim 1, wherein determining a number of data blocks with errors comprises:
retrieving a check sum associated with a retrieved data block from the storage medium;
generating a new check sum based on the retrieved data block; and
comparing the retrieved check sum with the new check sum to determine if the retrieved data block has errors.

4. The method of claim 3, wherein the check sum is a cyclic redundancy code.

5. The method of claim 1, wherein correcting the data blocks in data segments comprises:
for a data segment,
a) obtaining syndromes;
b) generating an error location polynomial based on the obtained syndromes;
c) determining an error location within the data segment using the error location polynomial;
d) generating an error value based on the determined error location within the data segment; and
e) correcting data at the determined error location within the data segment using the generated error value.

6. The method of claim 5, wherein a) further comprising:
generating one or more new redundancy blocks based on the retrieved data blocks;
generating one or more residual blocks based on the one or more new redundancy blocks and the retrieved redundancy blocks; and
for a data segment, generating syndromes based on the one or more residual blocks.

7. The method of claim 6, further comprising:
when the residual blocks for a data segment are zero,
determining that there are no errors in the data segment; and
repeating a) to e) for another data segment.

8. The method of claim 5, wherein b) comprises:
determining if there are less than two errors in the data segment based on the obtained syndromes and coefficients of the error location polynomial.

9. The method of claim 8, wherein when there are less than two errors in the data segment, determining a first error location within the data segment based on two of the obtained syndromes.

10. The method of claim 9, further comprising:
determining a second error location within the data segment based on two of the obtained syndromes, wherein at least one of the two syndromes used to determine the second error location is different than at least one of the two syndromes used to determine the first error location;, and wherein the first error location within the data segment is verified if the first and second error locations are the same.

11. The method of claim 10, further comprising:
determining a third error location within the data segment based on two of the obtained syndromes, wherein at least one of the two syndromes used to determine the third error location is different than at least one of the two syndromes used to determine the first and the second error locations, and wherein the first error location within the data segment is verified if the first, second, and third error locations are the same.

12. The method of claim 9, wherein the error value is one of the syndromes.

13. The method of claim 8, wherein when there are two errors in the data segment, solving the error location polynomial using a table.

14. The method of claim 8, wherein when there are two errors in the data segment, solving the error location polynomial using an exhaustive search to determine two error locations within the data segment with errors.

15. The method of claim 14, wherein the exhaustive search is performed at locations in the data segment corresponding to data blocks indicated by check sums as having errors.

16. The method of claim 14, wherein when more than two locations in the data segment are found to have error by performing the exhaustive search, determining that the data segment is not correctable.

17. The method of claim 14, wherein error values are generated based on the syndromes and the error locations.

18. The method of claim 5, wherein e) comprises:
multiplying the data at the determined error location with the generated error value to obtain a corrected data for the determined error location.

19. The method of claim 5, further comprising:
repeating a) to e) for another data segment.

20. A system of correcting errors in data retrieved from a storage medium, comprising:
a data buffer including:
a plurality of data blocks retrieved from the storage medium;
a plurality of redundancy blocks associated with the plurality of data blocks retrieved from the storage medium; and
a processor configured to:
determine a number of data blocks with errors from the plurality of data blocks retrieved from the storage medium;
determine if the number of data blocks with errors exceeds a number of redundancy blocks retrieved from the storage medium; and when the number of data blocks with errors exceeds the number of redundancy blocks, correct the data blocks in data segments, wherein a data segment includes data from a portion of each of the plurality of data blocks retrieved from the storage medium.

21. The system of claim 20, further comprising:
when the number of data blocks with errors does not exceed the number of redundancy blocks, correcting the data blocks using the redundancy blocks.

22. The system of claim 20, wherein the data blocks are corrected in data segments by:
for a data segment,
  a) obtaining syndromes;
  b) generating an error location polynomial based on the obtained syndromes;
  c) determining an error location within the data segment using the error location polynomial;
  d) generating an error value based on the determined error location within the data segment; and
  e) correcting data at the determined error location within the data segment using the generated error value.

23. The system of claim 22, wherein b) comprises:
determining if there are less than two errors in the data segment based on the obtained syndromes and coefficients of the error location polynomial.

24. The system of claim 23, wherein when there are less than two errors in the data segment, determining a first error location within the data segment based on two of the obtained syndromes.

25. The system of claim 24, wherein the error value is one of the syndromes.

26. The system of claim 23, wherein when there are two errors in the data segment, solving the error location polynomial using a table.

27. The system of claim 23, wherein when there are two errors in the data segment, solving the error location polynomial using an exhaustive search to determine two error locations within the data segment with errors.

28. The system of claim 27, wherein the exhaustive search is performed at locations in the data segment corresponding to data blocks indicated by check sums as having errors.

29. The system of claim 27, wherein when more than two locations in the data segment are found to have error by performing the exhaustive search, determining that the data segment is not correctable.

30. The system of claim 27, wherein error values are generated based on the syndromes and the error locations.

31. The system of claim 22, wherein e) comprises:
multiplying the data at the determined error location with the generated error value to obtain a corrected data for the determined error location.

32. The system of claim 22, further comprising:
repeating a) to e) for another data segment.

33. A computer-readable storage medium containing computer executable instructions for causing a computer to correct errors in data retrieved from a storage medium, comprising instructions for:
retrieving a plurality of data blocks from the storage medium;
retrieving a plurality of redundancy blocks associated with the plurality of data blocks from the storage medium;
determining a number of data blocks with errors from the plurality of data blocks retrieved from the storage medium;
determining if the number of data blocks with errors exceeds a number of redundancy blocks retrieved from the storage medium; and
when the number of data blocks with errors exceeds the number of redundancy blocks, correcting the data blocks in data segments, wherein a data segment includes data from a portion of each of the plurality of data blocks retrieved from the storage medium.

34. The computer-readable storage medium of claim 33, further comprising:
when the number of data blocks with errors does not exceed the number of redundancy blocks, correcting the data blocks using the redundancy blocks.

35. The computer-readable storage medium of claim 33, wherein correcting the data blocks in data segments comprises:
for a data segment,
  a) obtaining syndromes;
  b) generating an error location polynomial based on the obtained syndromes;
  c) determining an error location within the data segment using the error location polynomial;
  d) generating an error value based on the determined error location within the data segment; and
  e) correcting data at the determined error location within the data segment using the generated error value.

36. The computer-readable storage medium of claim 35, wherein b) comprises:
determining if there are less than two errors in the data segment based on the obtained syndromes and coefficients of the error location polynomial.

37. The computer-readable storage medium of claim 36, wherein when there are less than two errors in the data segment, determining a first error location within the data segment based on two of the obtained syndromes.

38. The computer-readable storage medium of claim 37, wherein the error value is one of the syndromes.

39. The computer-readable storage medium of claim 36, wherein when there are two errors in the data segment, solving the error location polynomial using a table.

40. The computer-readable storage medium of claim 36, wherein when there are two errors in the data segment, solving the error location polynomial using an exhaustive search to determine two error locations within the data segment with errors.

41. The computer-readable storage medium of claim 40, wherein the exhaustive search is performed at locations in the data segment corresponding to data blocks indicated by check sums as having errors.

42. The computer-readable storage medium of claim 40, wherein when more than two locations in the data segment are found to have error by performing the exhaustive search, determining that the data segment is not correctable.

43. The computer-readable storage medium of claim 40, wherein error values are generated based on the syndromes and the error locations.

44. The computer-readable storage medium of claim 35, wherein e) comprises:
multiplying the data at the determined error location with the generated error value to obtain a corrected data for the determined error location.

45. The computer-readable storage medium of claim 35, further comprising:
repeating a) to e) for another data segment.

* * * * *